United States Patent [19]
Cho

[11] Patent Number: 5,475,698
[45] Date of Patent: Dec. 12, 1995

[54] LIGHT EMISSION FROM RARE-EARTH ELEMENT-DOPED $CaF_2$ THIN FILMS

[75] Inventor: Chih-chen Cho, Richardson, Tex.

[73] Assignee: Texas Instruments Incorporated, Dallas, Tex.

[21] Appl. No.: 324,637

[22] Filed: Oct. 18, 1994

Related U.S. Application Data

[62] Division of Ser. No. 954,197, Sep. 30, 1992, Pat. No. 5,384,795.

[51] Int. Cl.⁶ ............................................. H01S 3/30
[52] U.S. Cl. ........................ 372/7; 372/69; 372/39; 372/44; 372/50
[58] Field of Search ........................ 372/7, 2, 41, 39, 372/69, 6, 44, 50, 45

[56] References Cited

U.S. PATENT DOCUMENTS

| | | | |
|---|---|---|---|
| 3,258,715 | 6/1966 | Johnson | 372/41 |
| 3,731,325 | 5/1978 | Wild et al. | 372/6 |
| 4,995,043 | 2/1991 | Kuwata et al. | 372/7 |
| 5,038,358 | 8/1991 | Rand | 372/69 |
| 5,107,538 | 4/1992 | Benton et al. | 358/130 |
| 5,117,437 | 5/1992 | Rand | 372/91 |
| 5,249,189 | 9/1993 | Scheps | 372/69 |
| 5,260,963 | 11/1993 | Baird et al. | 372/41 |
| 5,301,204 | 4/1994 | Cho et al. | 372/69 |

*Primary Examiner*—Leon Scott, Jr.
*Attorney, Agent, or Firm*—Michael K. Skrehot; James C. Kesterson; Richard L. Donaldson

[57] ABSTRACT

By growing semi-insulating $CaF_2$ films (296) on a silicon substrate (240), forming superlattice structures (260) made of $CaF_2$:Nd and other semiconductor layers (294) and by associating a co-dopant with Nd in the $CaF_2$ films photoluminescence efficiency of $CaF_2$ films is increased. This permits using electrons to produce photons and controlling optoelectronic devices using $CaF_2$ films through voltage variation.

16 Claims, 8 Drawing Sheets

$\lambda/2$ CaF$_2$:REI $\lambda/4$ CaF$_2$:REI

Si SUBSTRATE

LIGHT EMISSION FROM RARE-EARTH ELEMENT-DOPED CAF₂ THIN FILMS

This application is a divisional application of application for United States Letters Patent Ser. No. 07/954,197, filed Sep. 30, 1992, now U.S. Pat. No. 5,384,795 and entitled "Light Emission from Rare Earth Element Doped CaF₂ Thin Films by Electroluminescence."

TECHNICAL FIELD OF THE INVENTION

The present invention relates to laser and, more particularly, to a method and apparatus for generating light from Nd-doped $CaF_2$ thin films by various electroluminescence methods and structures.

BACKGROUND OF THE INVENTION

The availability of all-silicon-based optoelectronic integrated circuit (OEIC) technology promises revolutionize the optoelectronic industry and significantly impact a wide range of both military and commercial applications. One such area of impact multi-chip module interconnectivity. Silicon-based OEICs will not only solve resistivity and high-capacitance problems by replacing electron transport with photons, they will also provide new functionality, such as circuit-level image processing. Silicon-based OEICs will also provide cost inroads to commercial markets as high-volume silicon processes enjoy economies of scale unparalleled by other electronic or optoelectronic materials technologies. Furthermore, silicon-based OEICs are expected to provide new functionality such as circuit-level image processing.

There are four technologies required to make silicon-based OEICs a reality: (1) detectors; (2) waveguides; (3) modulators and (4) emitters. While there has been considerable progress in the first three areas, a lack of an appropriate silicon-based light-emitting device, particularly a silicon-based laser, has greatly hindered the development of fully integrated silicon-based OEIC technology.

Most work to date on silicon-based OEICs has been based on III-V materials. However, post-ultra-large-scale integrated (ULSI) circuit work will likely continue to use silicon substrates because of low material high mechanical strenqth, good thermal conductivity, and the highly developed processing methods available for silicon. One approach to integrating optical and digital electronics is to integrate III-V materials using epitaxially grown III-V layers for selected regions on silicon substrates. Although laser action from III-V layers grown epitaxially on silicon has been demonstrated, progress in this area has been limited by material quality problems resulting from the large lattice and thermal expansion mismatch between the two systems and incompatibilities between III-V material and silicon processing.

Reduced cavity size has been found to significantly affect laser characteristics for silicon-based lasers. When the cavity length is comparable to the wavelength of the cavity-defined radiation, cancellation of spontaneous emissions, zero-threshold lasing and enhanced gain may be achieved. The degree of gain enhancement is determined by the coherent length of the spontaneously emitted radiation. Gain enhancement has been predicted to increase more than five fold in III-V semiconductor microcavities as the emission linewidth decreases from 100 nm to 30 nm.

It has been shown possible to use certain thin films as a gain medium to produce high-intensity photoluminescence emissions. Nd-doped $CaF_2$ thin films that function as gain mediums are described herein and specifically claimed in co-pending U.S. patent application Ser. No. 07/954,136, now U.S. Pat. No. 5,306,385. It, however, is highly desirable to achieve light emission from these films by electroluminescence rather by photoluminescence. By achieving light emissions through electroluminescence, electrons, instead of photons, produce amplified photons. This permits using optoelectronic devices made from these films by voltage control or variation. However, electroluminescence from $CaF_2$-hosted materials has been generally unsuccessful, because $CaF_2$ has a wide bandgap material (12.1 eV) and, therefore, acts as a good insulator. Therefore, given poor electrical conductivity of these films, it is difficult to inject carriers into these films to excite the dopants.

As a result, there is a need for a method and apparatus that produces light emission from photoluminescence gain mediums such as $CaF_2$ thin films using electroluminescence.

There is a further need for a method and apparatus for producing electroluminescence emissions for optoelectronic devices made of $CaF_2$ thin films that permits voltage variation control of the opto-electronic devices.

Moreover, there is a need for a method and apparatus that permits carrier injection into $CaF_2$ thin films to excite dopants for photoluminescence gain from the $CaF_2$ thin films.

SUMMARY OF THE INVENTION

Accordingly, the present invention provides a method and apparatus for producing light emissions from Nd-doped $CaF_2$ thin films by electroluminescence that overcomes and reduces limitations associated with prior light emission methods and apparatuses such as microcavity lasers.

According to one aspect of the present invention, there is provided a method for emitting light from $CaF_2$ thin films using electroluminescence that comprises the steps of first forming a silicon substrate and then forming a $CaF_2$ thin film on the silicon substrate. The $CaF_2$ thin film includes a rare earth dopant and acts as a gain medium to amplify luminescence emissions that it receives. By associating an electroluminescence emission source with the $CaF_2$ thin film and then activating the electroluminescence source, the present invention generates luminescence emissions that are amplified by the $CaF_2$ films.

The present invention includes three different methods to excite the rare-earth doped $CaF_2$ electroluminescence. They include (1) using numerous layers of sputtered $CaF_2$ thin films, (2) placing numerous semiconductor layers interspersed with the $CaF_2$ thin films, and (3) adding a second dopant with Nd-doped $CaF_2$ thin films.

A technical advantage of the present invention is that with semi-insulating $CaF_2$ films grown according to one embodiment of the present invention, it is possible to take advantage of the low resistivity that is inherent in growing $CaF_2$ thin films by sputtering. As in the case of $CaF_2$ thin films grown by way of molecular beam epitaxy, the crystalline quality of the film is not critical to photoluminescent performance. This is in marked contrast to the dependence on crystalline quality that is inherent in known semiconductor lasers.

Another technical advantage of the present invention is that in the superlattice structure embodiment of the present invention, the thickness of each superlattice layers is less than the wavelength of the emission. As a result, constructive interference can be produced to enhance electroluminescence. This provides a highly practical way to achieve electroluminescence from a $CaF_2$:Nd/ZnS multi-layer structure.

3

Yet another technical advantage of the present invention is with the co-doped embodiment of the present invention, it is possible not only to emit photons from electroluminescence of such elements as Eu or Er, but it is possible also to emit photons by way of direct energy transfer from adjacent Eu atoms.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

I. Introduction

The development of microcavity lasers originated from studies of interactions between atoms/molecules and the electromagnetic radiation field. In 1946, Purcell predicted that the spontaneous emission rate of an excited atom would be changed if the atom were put in a cavity with dimensions similar to the radiation wavelength of the atom. Using fluorescent dyes, the phenomenon was demonstrated experimentally by Drexhage in 1974. In 1981, the issue was readdressed by Kleppner, and an increasing number of experimental and theoretical results were reported in the following decade. Recently, increasing interest in the fabrication of surface emitting laser devices, which are inherently composed of high-quality cavities and often radiation wavelengths of similar dimension, has notably escalated the studies of microcavity effects.

II. Microcavity Effects

A. Factors Controlling Microcavity Effects

For a conventional laser, the efficiency to couple emitted radiation into a mode is on the order of $10^{-4}$ to $10^{-5}$. When the optical modes are reduced to single mode by the formation of a microcavity, the coupling efficiency can be close to unity. Other unique features of a microcavity laser include thresholdless lasing, disappearance of relaxation oscillation, increase in dynamic response speed, and altered emission lifetime. The degree of microcavity effects is dependent on the emission linewidth of the gain medium, mirror reflectivity, difference in refractive indices between the gain medium material and the mirror materials, position and thickness of the gain medium, and the three dimensions of the cavity.

Figure 1:
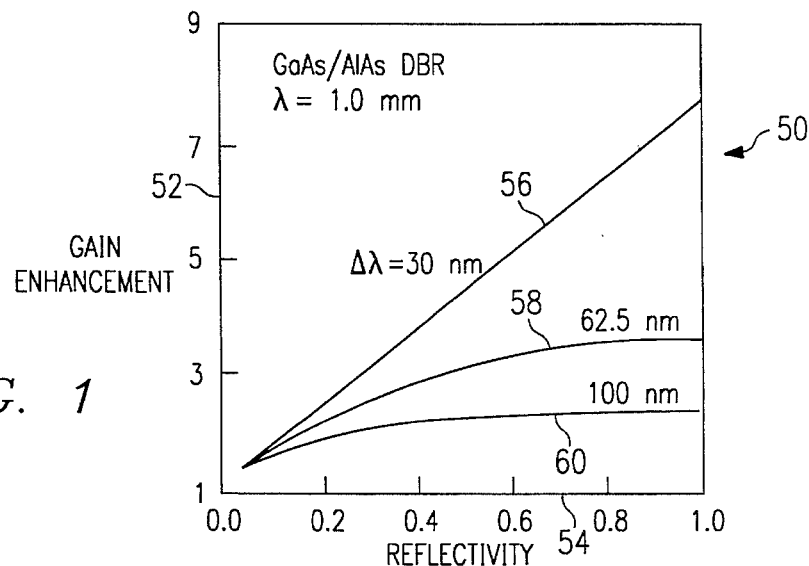
FIG. 1 shows the gain enhancement of a microcavity with several emission linewidths ranging from 30 nm to 100 nm which are typical for III-V semiconductor materials.

Microcavity effects have been calculated to increase as emission linewidth decreases. FIG. 1 shows the gain enhancement of a microcavity with several emission linewidths ranging from 30 nm to 100 nm, which are typical for Group III-V semiconductors. In particular, graph 50 of FIG. 1 shows along ordinate 52 a measure of gain enhancement versus reflectivity as plotted along abscissa 54. Exemplary linewidths are shown as line 56 for a 30 nm linewidth, line 58 for a 62.5 nm linewidth, and line 60 for a 100 nm linewidth. The gain enhancement for an emission with a 100-nm linewidth saturates at 2.4 when reflectivity is near unity. In contrast, the gain enhancement is 7.6 when the emission linewidth is 30 nm.

Microcavity effects are also strongly dependent on the quality of the cavity mirrors. FIG. 1 also shows that high-reflectivity mirrors provide high gain enhancement, especially when the emission linewidth is small. When a mirror is made of quarter-wavelength multilayer dielectric film (i.e., a distributed Bragg reflector (DBR)), the quantum efficiency increases as the difference in refractive index between the alternative films increases. In addition to the difference in refractive index, other factors such as control of film stoichiometry, interface sharpness, and film stress may also affect the performance of the mirrors.

The large difference in refractive index between $CaF_2$ and other semiconductors has prompted efforts to use $CaF_2$ as the material for high-quality Bragg reflectors. For example, using Bragg reflectors made of $CaF_2$ and ZnSe, a microcavity III-V semiconductor laser can be formed to exhibit laser performance that is superior in terms of threshold current and lasing efficiency to a laser using $Si/SiO_2$ mirrors.

Enhancement or prohibition of spontaneous emission in a microcavity can be achieved by controlling the length of a microcavity and the position of the active gain medium in the cavity. Enhanced emission occurs when the cavity length is tuned to the emission wavelength and the active gain medium is positioned at the antinode position. In this configuration, the field will interact with the gain medium. Reduced emission will be observed when the gain medium is located at a node position.

Theoretical analysis of a three-dimensional tetragonal microcavity confined normal to the surface by DBRs and transversely by cleaved planes suggests that with an emission linewidth at 1.5 nm the efficiency for coupling total radiation energy into a resonant mode (spontaneous emission factor) increases more than an order of magnitude when the transverse dimensions are reduced from 25 to 2 times the radiation wavelength. Similar enhancement in coupling efficiency has also been suggested for a cylindrical microcavity structure.

B. $CaF_2$ Films for Microcavity Effects

For the preferred embodiment, Al and $CaF_2$ films were grown on 4-inch diameter silicon wafers in an ultra-high vacuum system (VG Semicon V80) composed of a molecular beam epitaxy (MBE) chamber, a metallization chamber and a chemical vapor deposition chamber. Wafers can be transferred between these three chambers through a ultra-high vacuum transfer system, which is annexed with two loading locks. Base pressure of the MBE chamber and the metallization chamber were below $1 \times 10^{-10}$ mbar and $1 \times 10^{-9}$ mbar, respectively. The chamber pressure during $CaF_2$ growth was $5 \times 10^{-10}$ mbar and the process pressure during Al growth was $2 \times 10^{-9}$ mbar. $CaF_2$ and $NdF_3$ are evaporated thermally from effusion cells. The deposition rates of these fluorides are determined by controlling the cell temperatures and monitoring the pressure of the fluxes. The deposition rates increase proportionally as the flux pressures increase. The compositions of the films are determined by an X-ray fluorescence method. The thickness of the films are decided by step profile measurements. $CaF_2$:Nd films are grown on Si(111) and Al(111)/Si(111) substrates with substrate temperatures from 100° C. to 700° C. According to the results from photoluminescence (PL) spectra, the optimal growth temperature for $CaF_2$:Nd growth is 500° C. on silicon and 100°–300° C. on Al.

C. Photoluminescence from $CaF_2$:Nd Thin Films

Characterization of the optical properties of the films by photoluminescence (PL) show strong PL emission at ~0.9 μm, ~1.3 μm, and ~1.1 μm, including the 1,046-μm laser emission line observed for bulk $CaF_2$:Nd. As the thickness of the films decreases from 1 μm to 0.2 μm, the intensity decreases proportionally, and the emission wavelengths and the relative band intensities of the PL spectra from the $CaF_2$:Nd films grown on Al/Si remain unchanged. This result suggests that the luminescence properties of the films are not distorted, even though the 0.2-μm film is close to the $CaF_2$/Al interface where more defects tend to exist.

It is important to note that transition elements, instead of rare-earth elements may be used as dopants for the purposes of the present invention. Additionally, PL intensities of $CaF_2$:Nd films do not depend on the crystalline quality of the films. This is very different from semiconductor light-emitting materials, whose PL intensities are highly dependent on the crystalline quality of the materials. Consequently, they are more vulnerable to defects in the materials.

Figure 2:
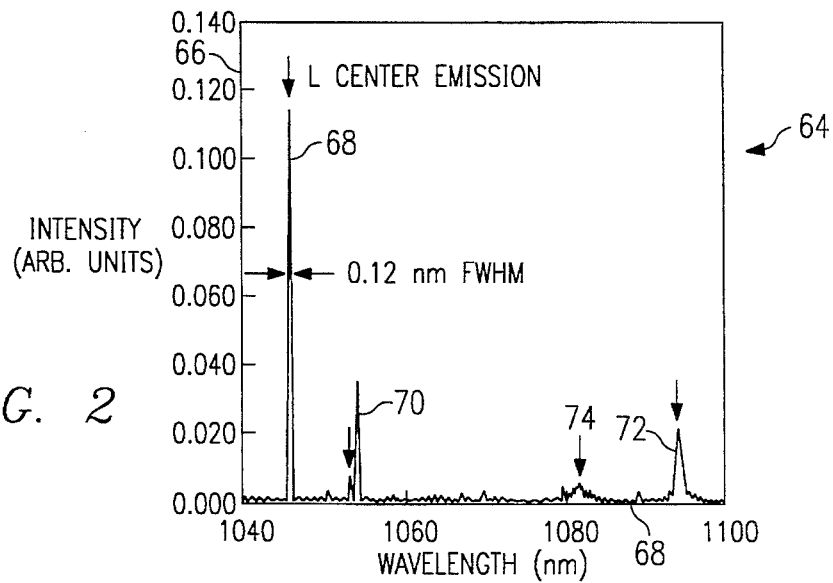
FIGS. 2 and 3 show the helium temperature photoluminescence spectrum of a 1.0 μm thick $CaF_2$:Nd film grown on a Al(111)/Si(111) substrate.
Figure 3:
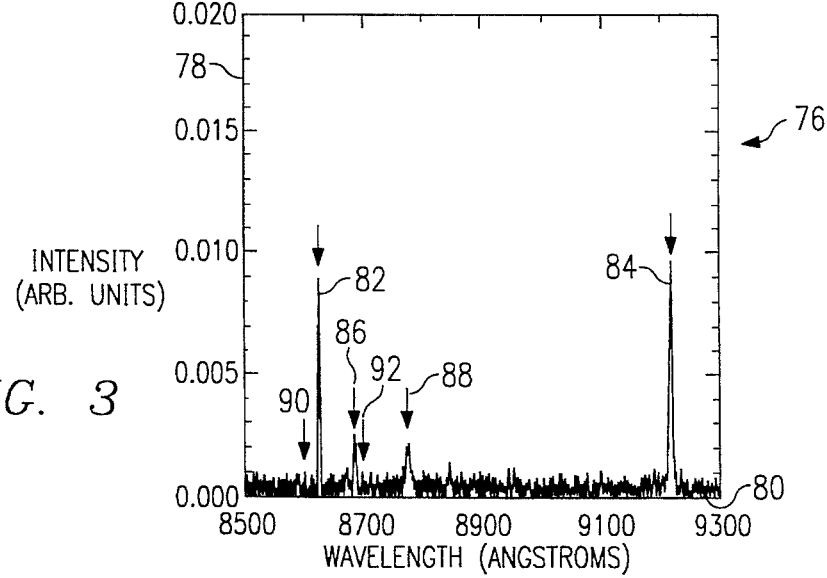

FIGS. 2 and 3 show the helium temperature PL spectrum of a 1.0-μm thick $CaF_2$:Nd (0.48 wt %) film grown on a Al(111)/Si(111) substrate. In FIG. 2, chart 64 has a possible intensity measurement range of 0.000 through 0.140 as arbitrary units along ordinate 66 and wavelength measurements ranging from 1040 nm through 1100 nm along abscissa 68. L center emission as indicated by luminescence spike 68 has a linewidth of 0.12 nm. Other luminescence peaks include peak 70, 72 and 74. The transitions shown in FIG. 2 are from $^4F_{3/2} \rightarrow {}^4I_{11/2}$ states.

Chart 76 of FIG. 3 includes a possible intensity measurement range from 0.000 through 0.020 in arbitrary units along ordinate 78 plotted against the wavelength range from 8500 to 9300 Å along abscissa 80. Luminescence peaks include approximately equivalent intensity peaks 82 and 84, smaller luminescence peaks 86 and 88, and yet smaller intensity peaks 90 and 92. The peaks in FIG. 3 result from $^4F_{3/2} \rightarrow {}^4I_{9/2}$ transitions. The emission wavelengths observed from L centers in bulk $CaF_2$:Nd are marked with arrows. Spectra from a 10 μm thick 0.3 wt. % $CaF_2$ film on a $CaF_2$ substrate, show similar wavelengths and relative intensities to those in FIG. 3.

The similarities of PL spectra for $CaF_2$:Nd grown by different methods and on different substrates suggest that, at low Nd concentrations, emission from L centers dominate. In contrast, as the Nd concentration increases, more significant differences in PL spectra are observed.

Figure 4:
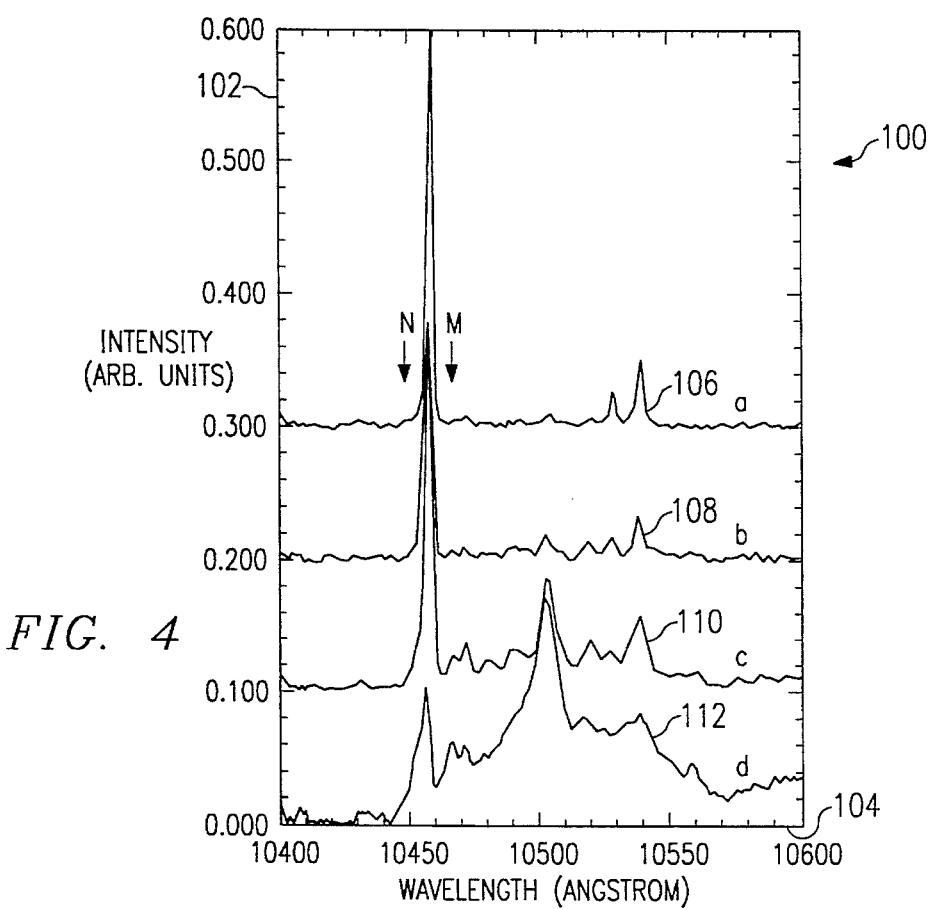
FIG. 4 shows concentration dependence on the luminescence from a one micrometer-thick $CaF_2$:Nd film grown on Al(111)/Si(111)

FIG. 4 shows concentration dependence of the luminescence from 1-μm-thick $CaF_2$:Nd films grown on Al/Si(111). Chart 100 of FIG. 4 illustrates intensity in arbitrary units ranging from 0.000 through 0.600 along ordinate 102 plotted against wavelengths in Angstroms ranging from 10400 through 10600 Å along abscissa 104. In particular, plot 106 records luminescence intensity for a 1-μm-thick $CaF_2$:Nd film with 0.48% Nd formed on a MBE-grown layer of Al/Si (111). Plot 108 plots luminescence intensity for the same thickness of $CaF_2$:Nd film with 0.96% Nd on Al/Si (111). Plot 110 shows luminescence for the same thickness of $CaF_2$:Nd film with 1.9% Nd on Al/Si(111). Plot 112 shows luminescence intensity for the same $CaF_2$:Nd film thickness with 3.8% Nd on Al/Si (111). The 10457 Å line, which is usually used for laser operation completely disappears in bulk material when the Nd concentration is above 3.8 wt. %.

The most important difference between the current films and previously reported bulk $CaF_2$:Nd and $CaF_2$:Nd/$CaF_2$ is the reduced intensity of emission lines from M and N defect centers in the current films even when the Nd concentration is as high as 3.8 wt. %. For bulk $CaF_2$:Nd with 3.8 wt. % Nd, the emission intensity from M and N centers are about the same as that from L centers. For $CaF_2$:Nd/$CaF_2$ with at least 3.7 wt. % Nd, the intensity of the luminescence at N centers is 80% the intensity at L centers. In contrast, FIG. 4 shows that no emission at the N center wavelength (10448 Å) is detected in any of the $CaF_2$:Nd on Al/Si samples. As the Nd concentration increases, a small peak appears corresponding to the M center (10467 Å) but the intensity is still only 50% of the intensity of the L center at a 3.8 wt. % Nd concentration.

These comparisons indicate that for the current $CaF_2$:Nd grown at low temperatures by MBE the orthorhombic N and M centers formed by aggregated $Nd^{3+}$-$F^-$ can be reduced. The low substrate temperature used to grow $CaF_2$:Nd/Al/Si may be the reason why low M and N defect $CaF_2$:Nd can be prepared. Low growth temperature may prevent fluorine loss and, thus, avoid the charge compensation mechanism in bulk $CaF_2$:Nd. Besides, the distribution of Nd-F and its aggregates can be altered by the low-temperature process, because the kinetic energy of the atoms is too low for the atoms to diffuse and reach an equilibrium state as occurs at temperatures above 600° C.

Figure 5:
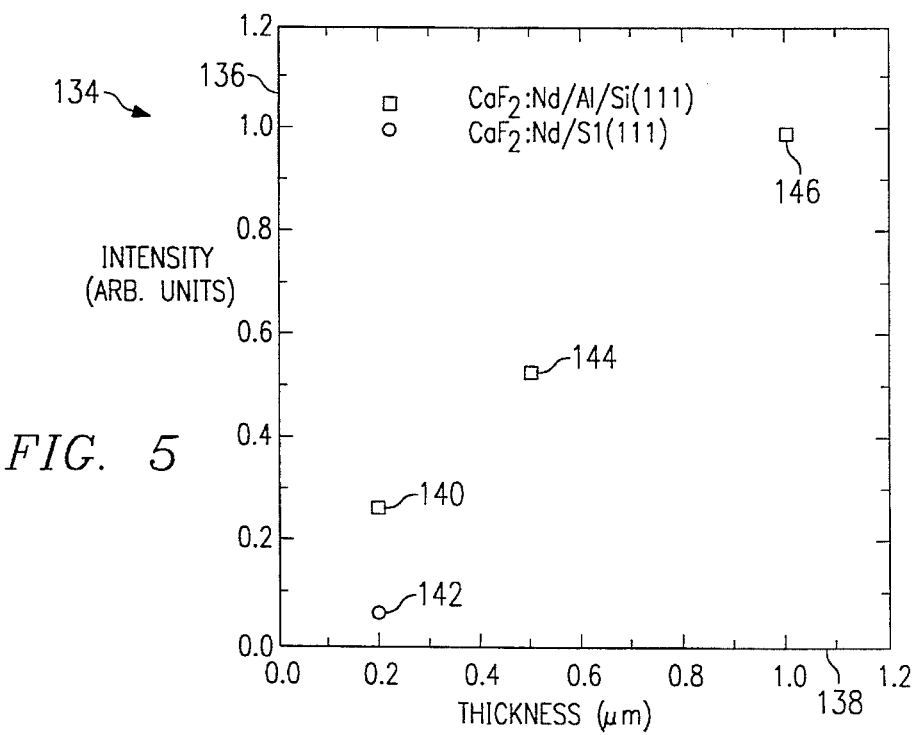
FIG. 5 shows the relative intensity of the 10457 Å line for $CaF_2$:Nd films grown on Al/Si(111) with various thicknesses.

FIG. 5 shows the relative intensity of the 10457 Å line for $CaF_2$:Nd (1.9 wt. %) films grown on Al/Si(111) with various thickness and a 0.2 μm $CaF_2$:Nd (1.9 wt. %) film grown on Si(111). The plot 134 of FIG. 5 records along abscissa 136 intensity in arbitrary units potentially ranging from 0.0 through 1.2 with $CaF_2$:Nd film thickness measurements ranging from 0.0 through 1.2 μm. Thus, with a thickness of 0.2 μm, the relative intensity for an $CaF_2$:Nd film on Al/Si(111) substrate is recorded as point 140. For a Si(111)

substrate relative intensity is recorded at point 142 for a 0.2-μm CaF$_2$:Nd film thickness. Other film thicknesses and relative intensities for two CaF$_2$:Nd film thickness include a 0.5 μm film thickness at point 144 and 1.0-μm thickness at point 146.

The PL intensity decreases proportionally as the thickness of the films reduces from 1.0 μm to 0.2 μm. Furthermore, the emission wavelengths and the relative PL intensity of the films are identical regardless of their thickness. These results suggest that luminescence properties are not distorted even when the film is only 0.2 μm, although the 0.2-μm-thick film is close to the CaF$_2$/Al interface and tends to be more vulnerable to interfacial defects. For films of the same thickness, but different substrates, the PL intensity of the CaF$_2$:Nd on Al is higher than that of the CaF$_2$:Nd on Si. The higher PL intensity from CaF$_2$:Nd on Al/Si(111) may be because over 90% of the 514.5 nm incident light is reflected into the CaF$_2$:Nd film from the Al layer, while the light is mostly absorbed in the Si substrate of CaF$_2$:Nd/Si(111).

Figure 6:
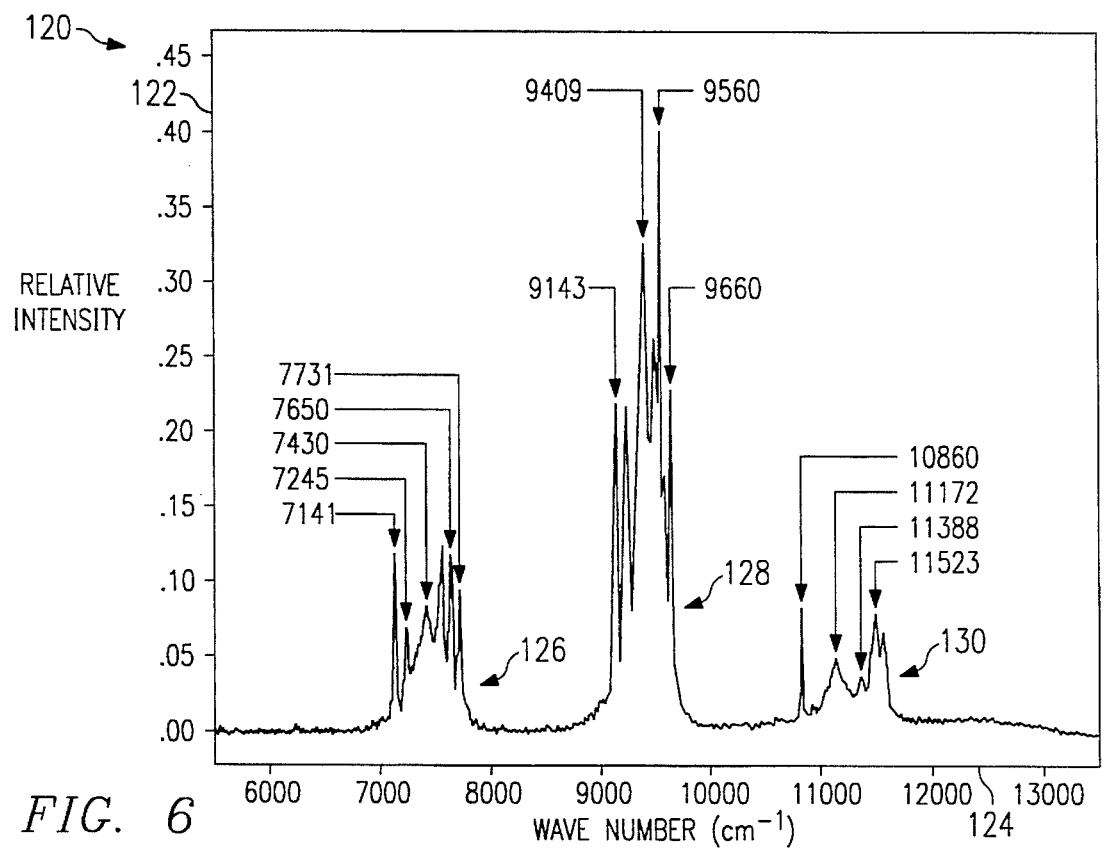
FIGS. 6 and 7 show the room-temperature photoluminescence spectra of a 0.2 μm thick $CaF_2$:Nd film (1%) and a 4.0 μm thick GaAs film.
Figure 7:
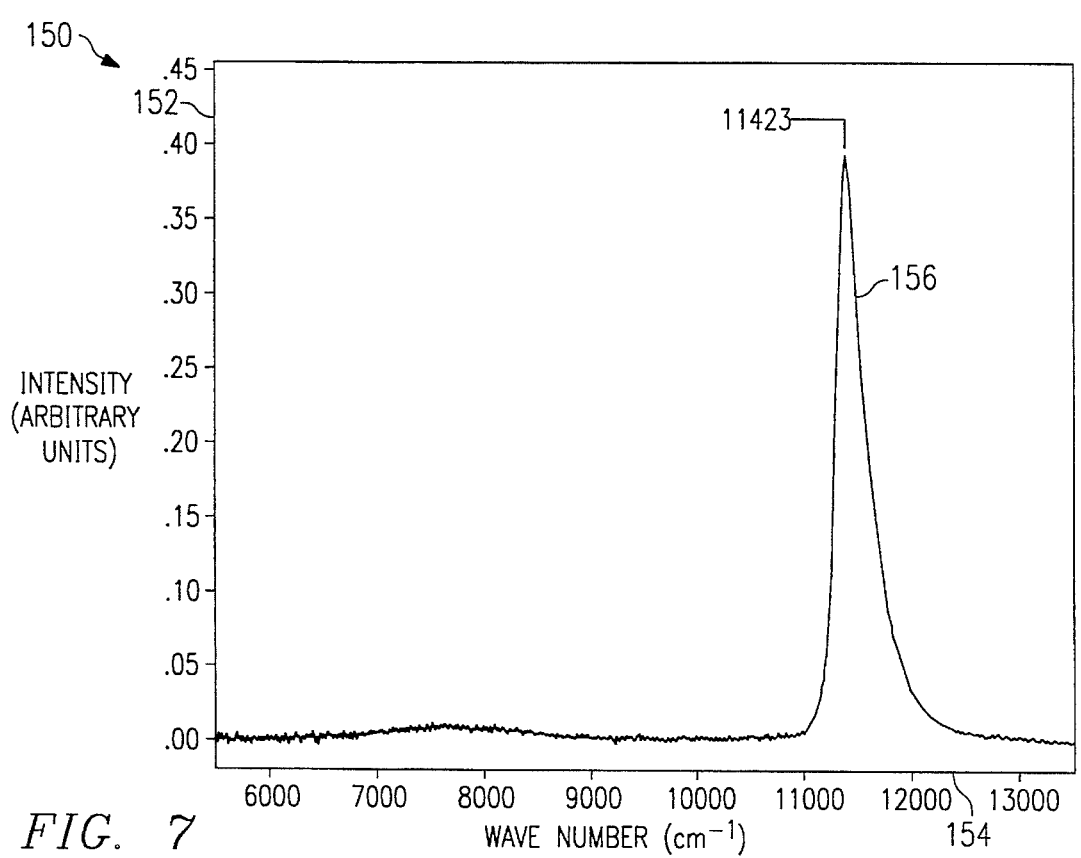

FIGS. 6 and 7 show the room-temperature PL spectra of a 0.2-μm-thick CaF$_2$:Nd (1%) film and a 4.0-μm thick GaAs film, respectively. In particular, plot 120 of FIG. 6 records along ordinate 122 relative intensity within a range from 0.00 through 0.45 in arbitrary units along a wavelengths range from 6,000 through over 13,000 cm$^{-1}$ along abscissa 124. PL intensity peaks occur in regions 126, 128 and 130. Within regions 126, 128, and 130, local specific frequencies associated with the identified intensity peaks are identified by associated wavelengths in plot 120 of FIG. 6.

In FIG. 7, plot 150 shows a range for relative intensity of from 0.000 through 0.450 along ordinate 152 with wavelengths in Angstroms ranging from less than 6,000 to greater than 13,000 cm$^{-1}$ along abscissa 154. Within this range, peak 156 shows a relative intensity of approximately 0.40 at a L center of 11,423 cm$^{-1}$. The CaF$_2$ film is grown on a Al(111)/Si(111) substrate. The GaAs film is grown on a Si(100) substrate. It is clearly shown that the linewidth of the CaF$_2$:Nd laser emission line (9560 cm$^{-1}$) is narrower than the linewidth of the 11423 cm$^{-1}$ GaAs peak.

The intensity of the CaF$_2$:Nd emission line in FIG. 6 is as strong as the intensity of the GaAs peak in FIG. 7, even though the CaF$_2$ thickness is only one-twentieth of the GaAs thickness. This indicates that CaF$_2$:Nd films can be a good gain medium for laser emission. The crystalline quality of the films are characterized by X-ray diffraction and exhibit a full-width-half-maximum of 130 arcseconds from the GaAs film. In contrast to GaAs, whose PL intensity strongly depends on the crystalline quality of the material, the PL intensity of CaF$_2$:Nd does not show detectable dependence on the crystalline quality of the film. Similar room temperature PL spectra from polycrystalline and single crystal CaF$_2$:Nd films of the same thickness and Nd concentration have been observed.

Comparison of these CaF$_2$:Nd samples with the high quality GaAs film grown on Si(100) (X-ray rocking curve halfwidth of GaAs = 130 arcsec) shows that the PL intensity from a 0.2-μm CaF$_2$:Nd(3.8 wt %)/Al/Si thin film is as high as that of the 4-μm-thick GaAs/Si sample, while incident light intensity is identical. The linewidths from the CaF$_2$:Nd films are 1.2 Å and 15 Å when the spectra are taken at 4.2 K and 300 K, respectively. In comparison, the PL linewidths from the GaAs/Si sample are 40 Å and 220 Å at 4.26 K and 300 K, respectively. The narrow emission linewidth of the CaF$_2$:Nd films and the small refractive index of CaF$_2$ are attractive characteristics of a microcavity laser using the concepts of the present invention. Good optical gain may be achieved because of the narrow linewidth. Also, high reflectivity mirrors can be fabricated by taking advantage of the large difference in refractive index between CaF$_2$ and semiconductors.

In summary, thin CaF$_2$:Nd films grown epitaxially on Al/Si(111) according to the preferred embodiment exhibit strong photoluminescence emission even when the film thickness is reduced to 0.2 μm. Suppressed luminescence from M and N centers can be obtained from the low-temperature-grown CaF$_2$:Nd films. The emission line at 10457 Å, which was used for laser operation from bulk CaF$_2$:Nd, shows very narrow linewidth and does not quench until the Nd concentration exceeds 3.8 wt. %. These features makes that CaF$_2$:Nd thin films an attractive gain medium for a microcavity laser fabricated on Si-based substrates.

III. CaF$_2$ Microcavity Devices

A. CaF$_2$ Microcavity Device Structures.

Yet another aspect of the preferred embodiment is the formation of CaF$_2$:Nd microcavity devices. High-intensity PL obtained from polycrystalline CaF$_2$:Nd forms the basis of microcavity structures composed of polycrystalline CaF$_2$:Nd films sandwiched by two DBRs (distributed Bragg reflectors) to illustrate the invention concepts of the preferred embodiments. The DBRs for these configuration are made of ten pairs of Ta$_2$O$_5$/SiO$_2$ multilayers. Four-inch silicon wafers were used as the substrates.

Figure 8:
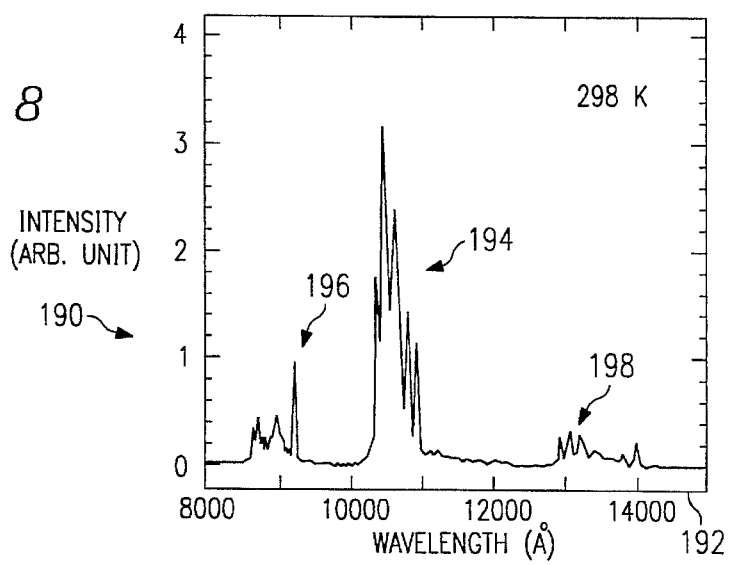
FIG. 8 shows photoluminescence spectra from $CaF_2$:Nd on a $Ta_2O_5/SiO_2$ distributed Bragg reflector.
Figure 10:
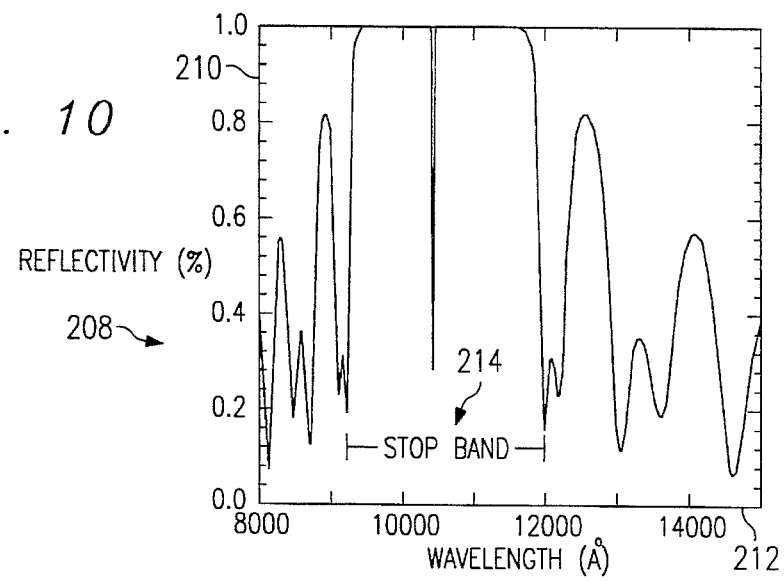
FIG. 10 illustrates the calculated reflectivity spectrum from a half-wavelength $CaF_2$:Nd//($Ta_2O_5/SiO_2$) microcavity using a one-dimensional model.

Shown in FIG. 8 is a room-temperature PL spectrum taken from a CaF$_2$:Nd film grown on a DBR. For FIG. 10, plot 190 records intensity in arbitrary units ranging from 0 through 4 along ordinate 191 against wavelengths in Å ranging from 8000 to approximately 15000 Å along abscissa 192. Peak regions of interest include peak region 194 and minor peak regions 196 and 198. No mirror was fabricated on the top of the CaF$_2$:Nd film. The spectrum shows very similar emission wavelengths and relative intensities to those observed from CaF$_2$:Nd films on Si(111) and Al(111)/Si(111).

Figure 9:
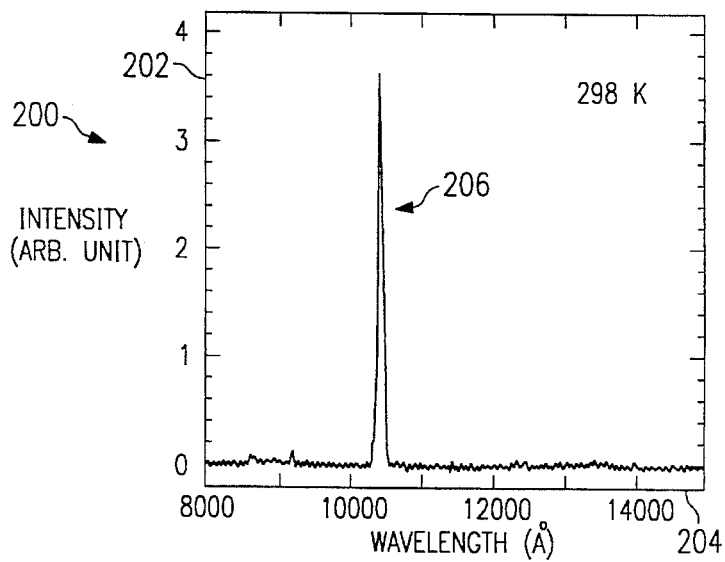
FIG. 9 shows the photoluminescence spectra from a half-wavelength $CaF_2$:Nd//($Ta_2O_5/SiO_2$) microcavity at room temperature.

FIG. 9 shows a room-temperature PL spectrum of a microcavity structure made of CaF$_2$:Nd and Ta$_2$O$_5$/SiO$_2$ multilayers. Plot 200 of FIG. 9 records intensity ranging from 0 to 4 in arbitrary units along ordinate 202 versus wavelength in Å ranging from 8000 to approximately 15000 Å along abscissa 204. Within plot 200, peak 206 shows the room-temperature PL spectra that the microcavity structure yields. The structure is the same as the sample used for FIG. 14, except that a top DBR mirror has been added to the structure, to form a one-wavelength CaF$_2$:Nd//(Ta$_2$O$_5$/Si)$_2$ cavity.

Comparing FIGS. 8 and 9, strong emission lines at 10453 Å and 10472 Å are detected in FIG. 9, while other emission lines around 10500 Å completely disappear. Furthermore, the intensities of the emission lines around 9000 Å and 13000 Å are observed to become much smaller in respect to the 10460 Å transition. These results indicate that the radiation rate at 10453 Å and 10472 Å are enhanced by the microcavity and the transitions around 9000 Å and 13000 Å are quenched. Intensity enhancement and linewidth reduction also observed for PL measurements at 77 K.

Shown in FIG. 10 is the calculated reflectivity spectrum for the one-wavelength CaF$_2$:Nd//(Ta$_2$O$_5$/SiO$_2$) microcavity structure. The structure is designed to form a resonant mode at 10460 Å. FIG. 10 shows that while the emission lines around 1050 nm ($^4F_{3/2} \rightarrow {}^4I_{11/2}$ transition) are in the "stopband," the transitions around 900 nm ($^4F_{3/2} \rightarrow {}^4I_{9/2}$ transition) and 1300 nm ($^4F_{3/2} \rightarrow {}^4I_{13/2}$ transition) are in the "passband" of the mirror structure. Consequently, the emission lines around 9000 Å and 13000 Å will not be affected directly by the reflectors and can be used as references when their intensities are compared with those around 10500 Å.

IV. Rare Earth(RE)-Doped CaF$_2$ Microcavity Devices

The preferred embodiment also exploits the optical properties of other RE-doped CaF$_2$ to use the effects of different emission wavelengths in a microcavity. Rare-earth ions that luminesce in the visible region are a particularly significant feature of the preferred embodiment. Although it is difficult to predict whether stimulated emissions can be obtained for given dopant transitions, the studies for rare-earth-doped bulk CaF$_2$ and other bulk crystals with similar crystal field environments indicate a wide selection of other laser center dopants applicable to the concepts of the present invention. Electroluminescence and photoluminescence from CaF$_2$ thin films doped with Eu have emission wavelengths centered in the blue at 420 nm, indicating that Eu-doped CaF$_2$ can be a good gain medium. Intense electroluminescence in the ultraviolet region with wavelengths as short as 306 nm have been observed in GdF3 doped ZnF$_2$ films. In addition to the Nd-doped CaF$_2$ thin films on silicon and Al/Si, Dy-doped bulk crystals may be used with the preferred embodiment. Dy-doped material exhibits photoluminescence emission features in the blue-green (around 486 nm), yellow (575 nm), red (665 nm) and near-infrared region of the spectrum (7540 Å and 8390 Å). Ho and Dy are good doping candidates, respectively, for green and yellow emitters.

V. Porous Si As A Light Source for RE-Doped CaF$_2$ Microcavity Devices

Instead of single crystal silicon, light emission from "porous Si" has been achieved by both electrical and optical pumping. Integrating porous silicon with Nd-doped CaF$_2$ provides a silicon-based material ("porous Si") with wide emission bandwidth as the light source and a silicon-based gain medium (CaF$_2$:Nd) with narrow emission bandwidth for lasing. The emission wavelengths of porous silicon are between 5200 Å and 9000 Å. These wavelengths are ideal for pumping CaF$_2$:Nd thin films.

Although porous silicon has been formed heretofore electrochemically, analytical studies of porous silicon show that this material is a mixture of amorphous silicon, crystalline silicon, silicon oxides and silicon hydrides. The term "porous Si", thus, refers to the silicon material that is able to emit visible light. These emissions can be achieved not only by anodizing crystalline silicon, but potentially by conventional growth techniques such as chemical vapor deposition (CVD) and molecular beam epitaxy (MBE).

Figure 11:
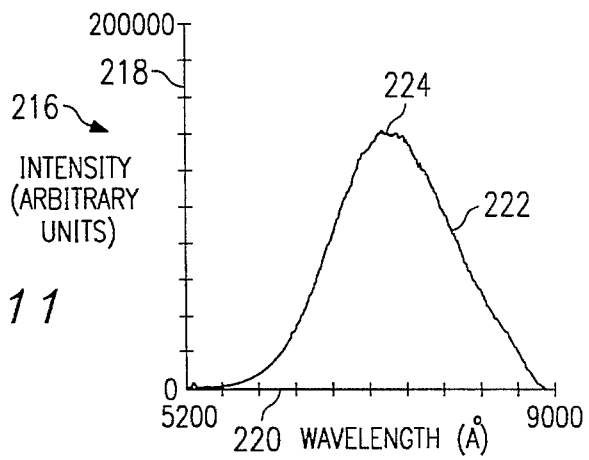
FIG. 11 shows a typical photoluminescence spectrum of porous silicon.

FIG. 11 shows a typical photoluminescence spectrum of porous silicon. Plot 216 of FIG. 14 records along ordinate 218 intensity in arbitrary units ranging from 0 to 200,000 and along abscissa 220 wavelengths ranging from 5,200 to 9,000 Å. Curve 220 shows the luminescence range for porous silicon with a peak 224 between approximately 7,250 and 7,400 Å. The luminescence of the preferred embodiment ranged from 5200 Å to 9000 Å with a maximum intensity at around 7000 Å. Since the absorption spectrum of CaF$_2$:Nd shows strong peaks at 7250–7450 Å 7800–8000 Å and 8500–8700 Å, the photons emitted from porous silicon that can be effectively absorbed by CaF$_2$:Nd. This results in high-intensity photoluminescence from CaF$_2$:Nd.

Figure 13:
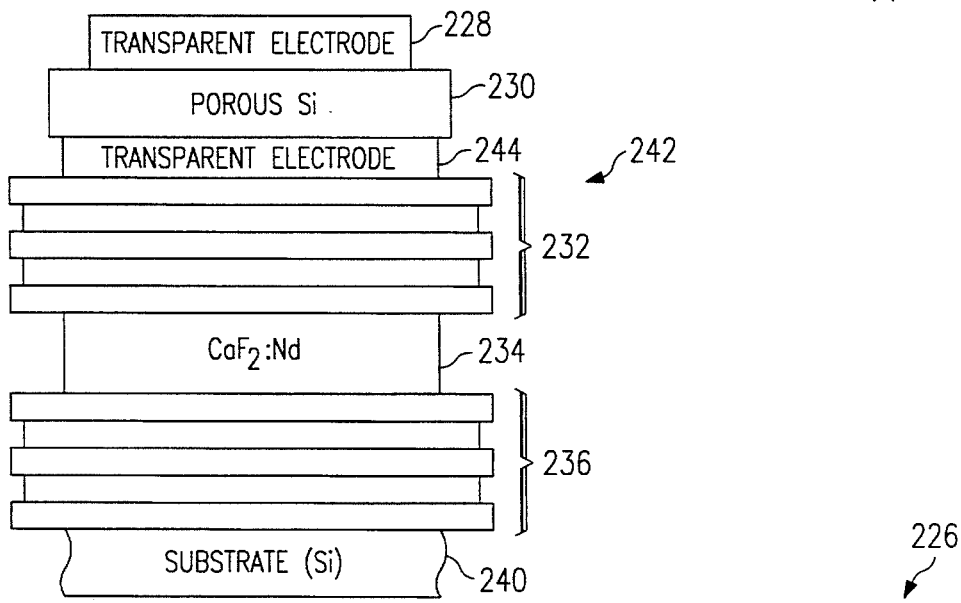
FIGS. 12 and 13 show two embodiments of the present invention that integrate porous silicon with $CaF_2$:Nd so that porous silicon can be used as the light source to pump a $CaF_2$:Nd gain medium.
Figure 12:
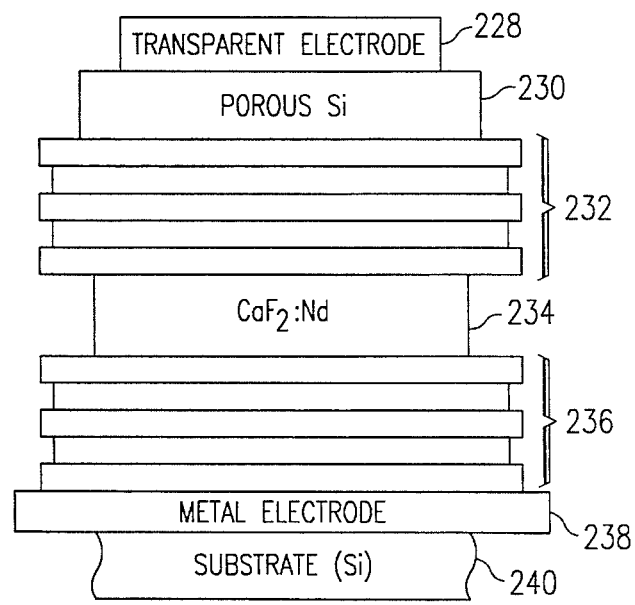

FIGS. 12 and 13 show two structures that integrate porous silicon with CaF$_2$:Nd. Structure 226 of FIG. 12 includes transparent electrode 228 attached to porous silicon layer 230 that is formed upon the first set of Bragg reflectors 232. Next, CaF$_2$:Nd layer 234 is sandwiched between Bragg reflector set 232 and Bragg reflector set 236. Bragg reflector set 236 is mounted to metal electrode 238 which has substrate 240 as its base. In these configurations, porous silicon can be used as the light source to pump CaF$_2$:Nd. While only five layers of dielectrics are shown for each Bragg reflector, the number of layers may be more than 10 pairs for vertical surface emitting laser device so that high reflectivity can be achieved. For edge emitting laser device, the requirement for high reflectivity is not as demanding as vertical surface emitting laser. A metal layer or a Bragg reflector of small number of pairs will be sufficient.

FIG. 13 shows another structure for porous Si as the light emitting source beginning with transparent electrode 228 over porous Si layer 230 which covers another transparent electrode 244. Attached to transparent electrode 244 is a first Bragg reflector set 232 which attaches to CaF$_2$:Nd layer 234. CaF$_2$:Nd layer 234 on its lower side attaches to Bragg reflector set 236. In the configuration of FIG. 16, Bragg reflector set 236 directly attaches to substrate 240. In FIG. 13 both porous silicon and CaF$_2$:Nd are sandwiched between the two electrodes. This structure allows the CaF$_2$:Nd layer to emit light by electroluminescence in certain cases. The CaF$_2$:Nd layer will also be optically pumped by the electroluminescence from porous Si. The drawback of the configuration in FIG. 16 is that the electric field gradient in the porous Si is not as strong as that in the porous Si in FIG. 15. In FIG. 16, the CaF$_2$:Nd layer is optically pumped by the electroluminescence from porous Si. No electric field variation takes place in CaF$_2$:Nd in this configuration.

Figure 14:
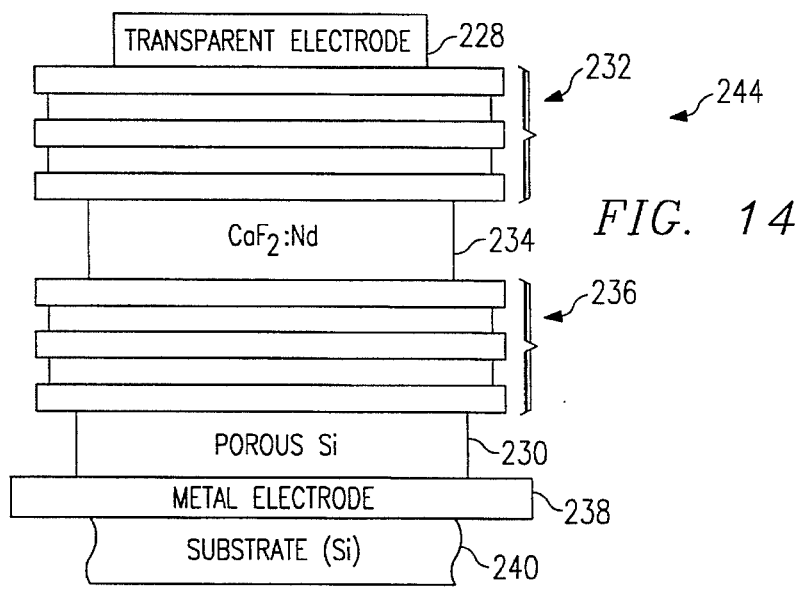
FIGS. 14 and 15 show two alternative embodiments of the present invention that are similar to the embodiments of FIGS. 15 and 16.
Figure 15:
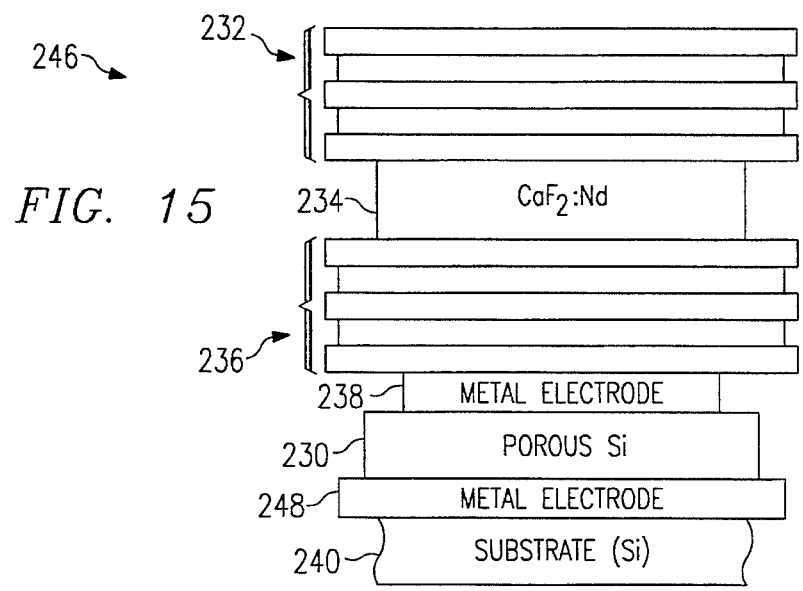
Figure 16:
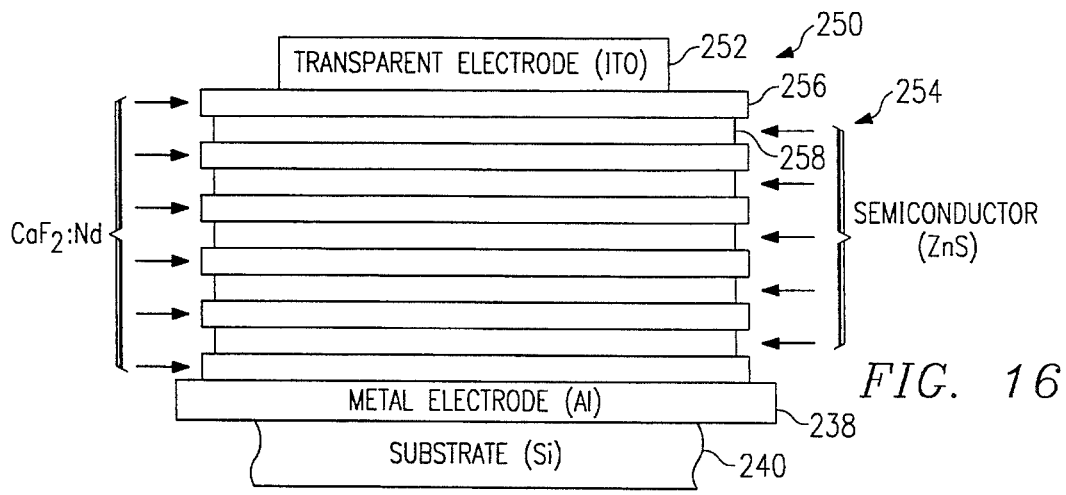
FIG. 16 shows a superlattice structure that can be used to obtain effective electroluminescence from a $CaF_2$:ZnS multilayer structure.
Figure 17:
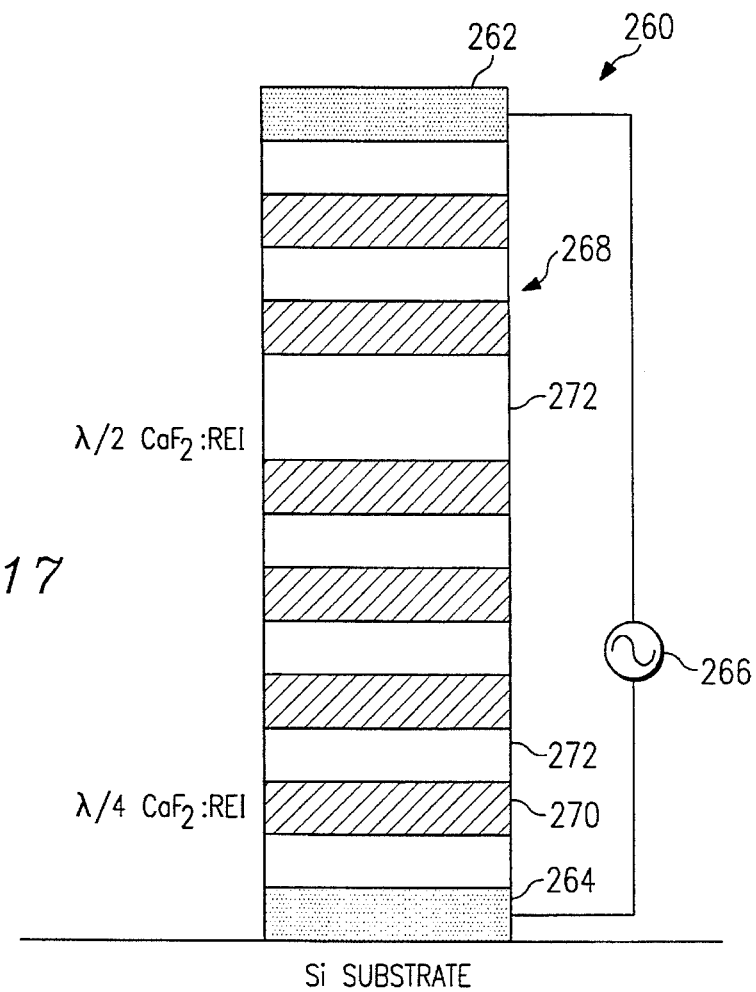
FIG. 17 and 18 illustrate conceptually two embodiments of an electrically-pumped quarter-wavelength shifted DFB laser using RE-doped $CaF_2$ as the gain medium.
Figure 18:
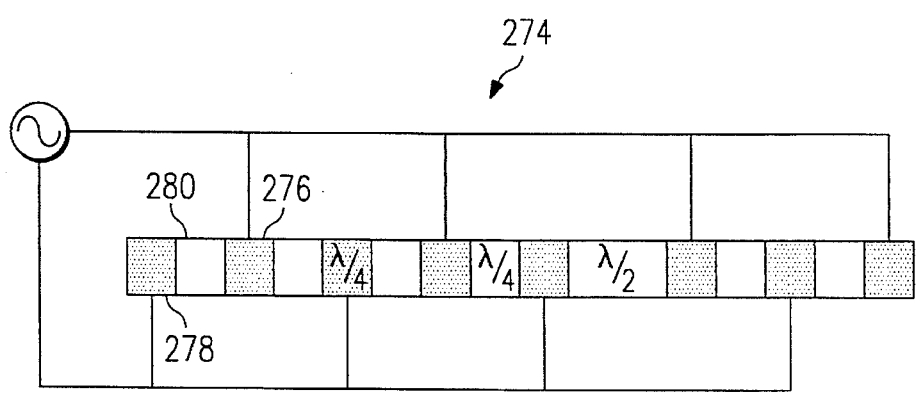

FIGS. 14 and 15 show two other structures that are similar to FIGS. 14 and 15, except that the porous Si is grown between CaF$_2$:Nd and Si substrate. FIG. 14 shows yet a further embodiment 244 with porous Si between the CaF$_2$:Nd gain medium and the substrate. In particular, transparent electrode 228 attaches to first Bragg reflector set 232 which covers CaF$_2$:Nd layer 234. CaF$_2$:Nd 234 attaches to Bragg reflector set 236. In the embodiment of FIG. 14, the porous Si layer 230 is positioned between second Bragg reflector set 236 and metal electrode 238. Metal electrode 238 attaches between porous Si layer 230 and substrate 240.

FIG. 15 also shows an embodiment 246 such that porous Si layer 230 is positioned between the CaF$_2$:Nd gain medium having CaF$_2$:Nd layer 234 and substrate 240. Particularly, Bragg reflector set 232 forms over CaF$_2$:Nd layer 234 cover a portion of Bragg reflector sets 236. Under Bragg reflector set 236 is metal electrode 238 that attaches to porous Si layer 230. A second metal electrode 248 separates porous Si layer 230 from substrate 240. In comparison with the structures in FIGS. 12 and 13, the structures in FIG. 14 and 15 make it difficult to grow single crystal materials on the top of the porous Si. However, these structures are more attractive for a surface emitting laser, because the porous Si is not located in the path of laser output. This increases the output efficiency of the laser device. Since the photoluminescence intensity from single crystal CaF$_2$:Nd is comparable to that from polycrystalline, it may not be necessary to obtain single crystal layers on the top of the porous Si for lasing.

VI. Light Emission from RE-Doped CaF$_2$ Thin Film by Electroluminescence

Several approaches can be used to increase the electroluminescence efficiency: (1) Semi-insulating CaF$_2$ films can be grown by sputtering; (2) Superlattice structures made of $CaF_2$:Nd and other semiconductors layers can be used so that carriers will accelerate effectively in the semiconductor layers and gain enough energy to induce Nd excitation in the $CaF_2$:Nd layers; and (3) Nd and another dopant such as Eu can be added together into $CaF_2$. Since $CaF_2$:Eu emits light at 420 nm by electroluminescence, the Nd can be pumped by the photons emitted from the electroluminescence of Eu or even excited by direct energy transfer from adjacent Eu atoms.

The following paragraphs discuss methods of the preferred embodiment to improve efficiency of electroluminescence. Note, also, that these methods can be used in a laser pumped by electroluminescence. The superlattice structure is similar to the cavity structure of a microcavity laser. When the length of a laser cavity is of the same order as the emitted wavelength, the laser characteristics can be significantly changed. In the microcavity domain, analysis and experiments suggest that optical gain significantly increases as the emission linewidth decreases, particularly when mirror reflectivity is high. Given the very narrow linewidth from submicron thick $CaF_2$:Nd described above and the fact that high reflectivity mirrors made of $CaF_2$/ZnSe have been demonstrated, a microcavity $CaF_2$:Nd laser pumped by electroluminescence may be achieved by improving the electroluminescence efficiency with the following methods.

The first of the above methods for improving the efficiency of electroluminescence is through the use of sputtered $CaF_2$. While the resistivity of a $CaF_2$ film grown by evaporation is around $10^{16}$ ohm-cm, a $CaF_2$ film with resistivity as low as $3 \times 10^3$ ohm-cm can be obtained by sputtering. The reduced resistivity is usually undesirable, because, in most cases, $CaF_2$ has been used as a good insulator that can be grown epitaxially on silicon or GaAs. However, good conduction properties are needed if the film is used for electroluminescence applications. Since a larger number of carriers can be driven through semi-conductive relative to insulating films, the collision cross-section between the carriers and luminescence centers in $CaF_2$:Nd will be larger in the semi-conductive sputtered films. This results in increased luminescence intensity. Similar approach was taken by annealing $CdF_2$:Mn in Cd vapor to make $CdF_2$:Mn lase by electroluminescence. One possible disadvantage of the sputtered $CaF_2$ is enhanced emission quenching because of degraded crystalline quality. However, this may not be a serious problem, because, as shown for MBE-grown $CaF_2$:Nd, the photoluminescence intensity of a polycrystalline $CaF_2$:Nd film is the same as that of a single crystal $CaF_2$:Nd. This indicates that crystalline quality may not be critical.

The second above-stated method for greater electroluminescence efficiency is the formation of $CaF_2$:Nd semiconductor superlattices. Superlattice structures made of $CaF_2$:Nd and other semiconductors layers can be used so that carriers will accelerate effectively in the semiconductor layers and, thus, gain enough energy to induce Nd excitation in the $CaF_2$:Nd layers. This successfully improves the emission efficiency of a $Y_2O_3$:Eu thin-film electroluminescence devices. Furthermore, when the thickness of each superlattice layers is less than the wavelength of the emission, constructive interference can be produced to enhance the luminescence when the thickness is tuned properly.

FIG. 16 shows a superlattice structure that can be used to obtain effective electroluminescence from a $CaF_2$:Nd/ZnS multilayer structure. The $CaF_2$:Nd semiconductor superlattice structure 250 of FIG. 16 includes transparent electrode 252 over $CaF_2$:Nd/semiconductor superlattice 254. $CaF_2$:Nd/semiconductor superlattice 254 includes $CaF_2$:Nd layers such as layer 256 interspersed with semiconductor layers using, for example, ZnS to achieve the desired degree of electroluminescence. $CaF_2$:Nd/semiconductor superlattice 254 is formed over metal electrode 238 which forms over substrate 240.

Transparent conductors can be made of conductive oxides, such as indium tin oxide (ITO) or aluminum-doped zinc oxide, or heavily doped semiconductors such as ZnSe or ZnS. These materials offer good electrical conductivity and optical transparency at the emissions wavelength. Since the transparent conductors also act as mirrors to provide optical feedback, the refractive index should be as different as possible from that of $CaF_2$:Nd (or other RE-doped $CaF_2$) so that strong microcavity effects can be achieved. The refractive index of ITO ranges form 1.75 to 2.3. The refractive indices of zinc oxide, ZnS, and ZnSe are around 1.86, 2.37, and 2.89, respectively, at 1-µm wavelength. Since the refractive index of RE-doped $CaF_2$ is about 1.43, these materials should be able to form high-quality DBR, or the periodic gain structure in distributed feedback lasers, with the RE-doped $CaF_2$ to enhance the cavity effects.

Yet another method to improve electroluminescence efficiency is though the formation of co-doped $CaF_2$. Nd and another dopant, such as Eu or Er, can be added together into $CaF_2$. $CaF_2$:Eu has been shown to emit light at 420 nm by electroluminescence. When Eu and Er are co-doped with Nd in $CaF_2$, absorption at 398 nm and 449 nm for Eu and Er, respectively, has been observed. These results suggest that, by growing a $CaF_2$:Nd/Eu or a $CaF_2$:Nd/Er film, the Nd can be pumped by the photons emitted from the electroluminescence of Eu or Er, or even excited by direct energy transfer from adjacent Eu atoms to obtain enhanced luminescence.

Based on knowledge of the materials and features of a laser cavity, additional laser structures that are likely to achieve lasing by electroluminescence are shown in FIGS. 17, 18, 19 and 20. The vertical configuration 260 of FIG. 17 includes transparent conductor 262 and metal conductor 264 having a potential applied by independent voltage source 266 to activate laser 268. Laser 268 includes interspersed layers of quarter-wavelength semiconductor 270 and quarter-wavelength $CaF_2$:RE layers 272 to serve as the gain medium. Similarly, horizontal configuration 274 of FIG. 18 includes numerous transparent conductors such as transparent conductors 276 and 278 with $CaF_2$:RE gain medium in 280 interspersed therebetween.

Figure 19:
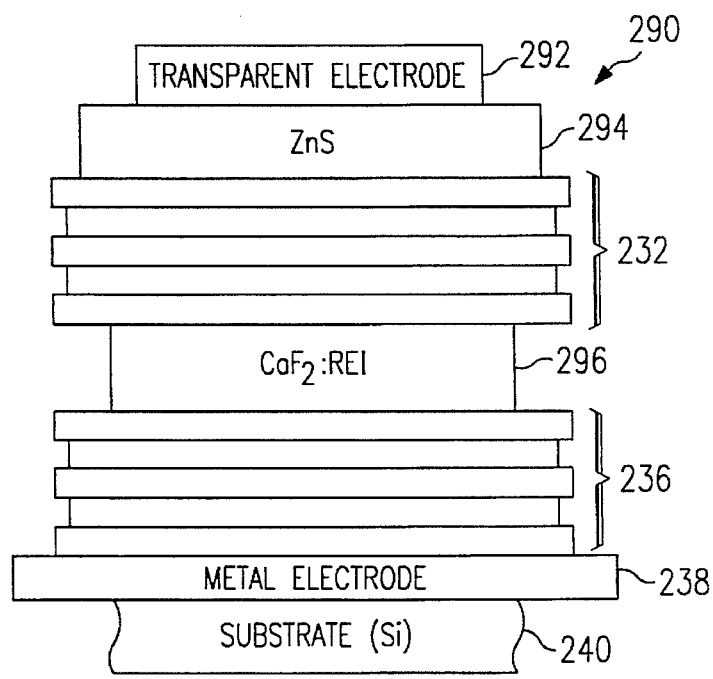
FIGS. 19 and 20 illustrate two structures that use electroluminescence ZnS as a light emitting source and $CaF_2$:RE as a gain medium.
Figure 20:
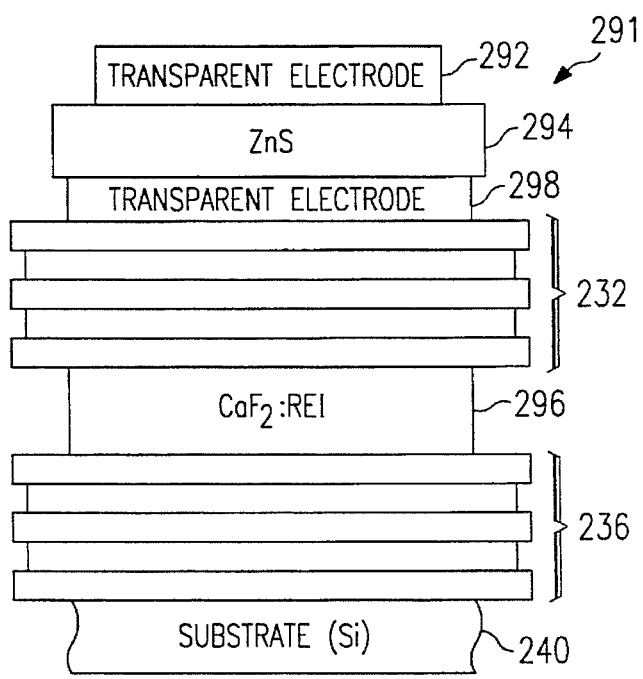

FIGS. 19 and 20 illustrate two configurations that use electroluminescence ZnS as a light emitting source as configurations 290 and 291. Configuration 290 of FIG. 19 includes transparent electrode 292 formed over ZnS layer 294. ZnS layer 294 serves as the electroluminescence light source for Bragg reflector set 232, $CaF_2$:RE layer 296 and second Bragg reflector set 236. Second Bragg reflector set 236 forms over metal electrode 238 which attaches to substrate 240.

Configuration 291 of FIG. 20 includes transparent electrode 292 which is formed over ZnS layer 294. ZnS layer 294 forms over a second transparent electrode 298 which connects to Bragg reflector set 232. Between Bragg reflector set 232 and Bragg reflector set 236 is $CaF_2$:RE layer 296. Second Bragg reflector set 236 attaches directly to substrate 240 in the configuration of FIG. 23.

VII. Exemplary Applications Within The Scope of Present Invention

Extensive research has been conducted recently to achieve light emission from group IV materials. Light emission from porous Si, isoelectronically doped silicon, and strained GeSi alloys have been reported. Considering that these materials are compatible with silicon-based technologies and that a very low lasing threshold may be achieved from the RE-doped $CaF_2$ microcavity laser, the preferred embodiment of the proposed microcavity laser readily accommodates these materials within the scope of the invention.

The availability of silicon-based OEICs and photonic integrated circuits (PICs) has a wide range of military and commercial uses. One application of silicon-based OEICs or PICs is in the area of multichip module interconnectivity. As the complexity of multichip modules increases, interconnect resistivity and parasitic capacitance created by high-density metal lines pose major obstacles to system performance. Optical interconnectivity has long been considered a solution to these interconnectivity problems. Silicon-based OEICs and PICs, for example, have specific application for optically coupling phased-array radar elements. Whereas significant progress has been made in the area of GaAs and other III-V-based monolithic microwave integrated circuits (MMICs) for radar elements, work on digital logic and memory circuitry based on III-V materials has not been as fruitful. Hence, optical sources and modulators monolithically integrated with silicon digital circuitry may provide a mechanism for optically coupling state-of-the-art silicon digital and logic circuitry to GaAs MMIC elements.

Current work in the area of optical computing is largely limited to III-V and $LiNbO_3$ materials systems. With the exception of a silicon-based laser source, all other functions required for optical computing (modulators, detectors, and waveguides) have been demonstrated. In fact, large-scale integration (LSI) silicon detectors (e.g., CCDs) are commercially available, and medium-scale integration (MSI) modulators on silicon (e.g., DMDs) have been demonstrated and are beginning to be commercially produced. Whereas DMDs are free-space modulators, materials such as $BaTiO_3$ and $(Pb,La)(Zr, Ti)O_3$ (which have excellent electro-optic properties) are used for high dielectric capacitors in post-ULSI silicon memory applications that may be employed with the various configurations of the preferred embodiment. $SiO_2$ waveguides on silicon have also been demonstrated.

Silicon-based OEICs and PICs formed according to the concepts of the preferred embodiment are particularly attractive, because existing high-volume silicon processes enjoy an economy of scale unparalleled by other electronic or optoelectronic materials technologies. Possible applications of silicon-based OEICs formed by the present invention are silicon-based emitters for displays, fiber to the home and other cable networks, computer communication systems for automotive electronics, and low-cost disposable OEICs for medical and in vivo uses. Finally, silicon-based OEICs according to present invention may provide new functionality such as circuit-level image processing devices or smart pixels.

VIII. Summary

In summary, concepts within the scope of the present invention include (1) preparation of thin $CaF_2$:RE films; (2) fabricating optically pumped silicon-based $CaF_2$:Nd microcavity lasers including the growth of $CaF_2$ with other RE dopants, (3) growing and fabricating electroluminescent sources appropriate for pumping $CaF_2$:RE microcavities, and (4) achieving laser action by either electroluminescent or direct electrical pumping.

Although the present invention and its advantages have been described in detail, it should be understood that various changes, substitutions and alterations can be made herein without departing from the spirit and scope of the invention as defined by the appended claims.

What is claimed is:

1. A method for fabricating an apparatus for inducing light emission from electroluminescent stimulation, comprising:
   providing a silicon substrate;
   sputtering a $CaF_2$ thin film over said silicon substrate;
   doping said $CaF_2$ thin film with a rare-earth dopant; and
   providing a source of luminescence in proximity to said $CaF_2$ thin film.

2. The method of claim 1 wherein said rare-earth dopant is Nd.

3. The method of claim 1 wherein said step of sputtering said $CaF_2$ thin film is performed at a temperature in the range of approximately 100° C. to 700° C.

4. The method of claim 3 wherein said temperature is approximately 500° C.

5. The method of claim 1 wherein said silicon substrate is in the (111) orientation.

6. A method for fabricating an apparatus for inducing light emission from electroluminescent stimulation comprising:
   providing a silicon substrate;
   forming a superlattice over said substrate, said superlattice comprising alternately arranged $CaF_2$ thin films and semiconductor thin films; and
   doping said $CaF_2$ thin films with a rare-earth dopant.

7. The method of claim 6 wherein said step of forming a superlattice comprises forming the thickness of each of said thin films in said superlattice to be less than the wavelength of a spectral emission from said $CaF_2$ thin films.

8. The method of claim 6 wherein said semiconductor layers comprise ZnS.

9. The method of claim 6 further comprising the step of forming a metal electrode between said superlattice and said substrate and a transparent electrode over said superlattice.

10. The method of claim 9 wherein said transparent electrode is selected from a group comprising indium tin oxide, aluminum-doped zinc oxide, zinc selenide, and zinc sulfide.

11. The method of claim 9 wherein the refractive index of said transparent electrode is in the range between approximately 1.5 to approximately 3.0.

12. The method of claim 9 wherein said metal electrode comprises aluminum.

13. A method for fabricating an apparatus for inducing light emission from electroluminescent stimulation comprising:
   providing a substrate;
   forming a layer of $CaF_2$ over said substrate;
   doping said layer of $CaF_2$ with two rare-earth elements, whereby electroluminescence from one of said dopants produces photoluminescence from the other of said dopants.

14. The method of claim 13 wherein one of said dopants is Nd.

15. The method of claim 13 wherein one of said dopants is Nd and the other of said dopants is Eu.

16. The method of claim 13 wherein one of said dopants is Nd and the other of said dopants is Er.

* * * * *